United States Patent
Jaulin

(10) Patent No.: US 12,160,263 B2
(45) Date of Patent: Dec. 3, 2024

(54) METHOD AND A DEVICE FOR TRANSMITTING OPTICAL SIGNALS WITH AVERAGE POWER ADAPTED TO TEMPERATURE AND TO AGEING, AND A CORRESPONDING COMPUTER PROGRAM AND PROGRAM MEDIUM

(71) Applicant: SAGEMCOM BROADBAND SAS, Rueil Malmaison (FR)

(72) Inventor: Jean-Philippe Jaulin, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 208 days.

(21) Appl. No.: 17/553,046

(22) Filed: Dec. 16, 2021

(65) Prior Publication Data

US 2022/0200700 A1    Jun. 23, 2022

(30) Foreign Application Priority Data

Dec. 18, 2020 (FR) ...................... 2013734

(51) Int. Cl.
*H04B 10/079* (2013.01)
*H04B 10/50* (2013.01)
*H04B 10/564* (2013.01)

(52) U.S. Cl.
CPC ..... *H04B 10/07955* (2013.01); *H04B 10/503* (2013.01); *H04B 10/564* (2013.01)

(58) Field of Classification Search
CPC ............ H04B 10/07955; H04B 10/503; H04B 10/564; H04B 10/504; H04B 10/505; H04B 10/5055; H04B 10/5057; H04B 10/5059; H04B 10/40; H04B 10/50; H04B 10/502; H04B 10/0795; H04B 10/07953; H04B 10/0799
See application file for complete search history.

(56) References Cited

U.S. PATENT DOCUMENTS

| | | | | |
|---|---|---|---|---|
| 4,221,483 A | * | 9/1980 | Rando ................. | G01C 15/004 356/250 |
| 5,383,208 A | * | 1/1995 | Queniat ............... | H04B 10/564 372/50.1 |
| 5,621,293 A | * | 4/1997 | Gennesseaux ......... | F16F 15/03 318/653 |

(Continued)

FOREIGN PATENT DOCUMENTS

| | | |
|---|---|---|
| CN | 107045253 B | 11/2018 |
| CN | 210922619 U | 7/2020 |
| EP | 3276304 A1 | 1/2018 |

*Primary Examiner* — Hibret A Woldekidan
(74) *Attorney, Agent, or Firm* — MUNCY, GEISSLER, OLDS & LOWE, P.C.

(57) ABSTRACT

A data transmission method including the step of controlling excitation current for a laser diode of a laser beam emitter device by servocontrolling the excitation current on laser beam power and by modulating the excitation current as a function of the data for transmission in order to encode the data with laser beam power levels, the method being characterized in that it includes the step of measuring a temperature ($T_{INT}$) in the vicinity of the laser diode in order to perform, in accordance with the invention, two modes of operation having different setpoint values.

14 Claims, 4 Drawing Sheets

(56) References Cited

U.S. PATENT DOCUMENTS

| | | | | |
|---|---|---|---|---|
| 6,370,175 | B1* | 4/2002 | Ikeda | H04N 1/4015 |
| | | | | 372/38.1 |
| 7,166,826 | B1* | 1/2007 | Kunst | H01S 5/0683 |
| | | | | 372/33 |
| 7,395,604 | B2* | 7/2008 | Chien | G01C 15/004 |
| | | | | 33/290 |
| 2005/0111501 | A1* | 5/2005 | Chieng | H01S 5/06804 |
| | | | | 372/38.07 |
| 2009/0141760 | A1* | 6/2009 | Saito | G11B 7/1263 |
| | | | | 372/38.02 |
| 2014/0055086 | A1* | 2/2014 | Malackowski | H02J 7/007194 |
| | | | | 320/107 |
| 2017/0188420 | A1* | 6/2017 | Kido | H05B 47/24 |
| 2021/0257146 | A1* | 8/2021 | Chetanneau | H01F 27/255 |

* cited by examiner

METHOD AND A DEVICE FOR TRANSMITTING OPTICAL SIGNALS WITH AVERAGE POWER ADAPTED TO TEMPERATURE AND TO AGEING, AND A CORRESPONDING COMPUTER PROGRAM AND PROGRAM MEDIUM

The present invention relates to transmitting data, and more particularly to transmitting data by optical signals.

BACKGROUND OF THE INVENTION

A system for communication by optical signals generally comprises an optical signal emitter device, an optical signal receiver device, and an optical fiber extending between the emitter device and the receiver device.

The emitter device generally comprises a laser diode and an amplifier member current-driving the laser diode in such a manner as to modulate the laser signal as a function of a digital signal coming from a processor that formats the data for transmission in accordance with the communication protocol being used for the transmission. The optical signal emitted by the emitter device into the optical fiber is made up of a succession of power levels that vary as a function of time to form symbols that have digital value that depend on the instantaneous power received by the receiver device at the center time of each received symbol.

A laser diode produces a power beam when the laser diode is subjected to an excitation current of magnitude greater than a laser threshold ($I_{TH}$). In FIG. 1, there is plotted the power $P_{out}$ of the laser beam produced by a laser diode that is powered by an excitation electric current $I_{Drive}$. It can be seen that, when the magnitude $I_{Drive}$ of the excitation current exceeds the laser threshold $I_{TH}$, the laser diode produces a beam of power $P_{out}$ that increases in almost linear manner with increasing excitation current from the laser threshold up to a point of inflection referred to as the "rollover" beyond which point power decreases in spite of an increase in the magnitude of the excitation current. The efficiency (SE) of the laser diode is the slope of the linear portion of the curve plotting power as a function of excitation current.

Furthermore, in order to be usable for transmitting the signal, it is known that a laser beam needs to have an average power $P_{avg}$ lying in a predefined range in association with an extinction ratio (ER) that is sufficiently large. The extinction ratio is equal to 10 log(P1/P0) and it is thus representative of the ratio of the relatively high light power P1 corresponding to logic level 1 divided by the relatively low light power P0 corresponding to logic level 0: the difference between the powers P1 and P0 on emission needs to be large enough to ensure that logic level 1 can be distinguished from logic level 0 in the optical signal as received by the receiver device. The average power $P_{avg}$ is the average of the powers of the transmitted signal, and it can be approximated by calculating the average of the powers P1 and P0. FIG. 2 shows the power $P_{out}$ of the optical signal plotted as a function of the excitation current $I_{Drive}$, with the power P1 corresponding to an excitation current I1 and with the power P0 corresponding to an excitation current I0.

It is known that the laser threshold and efficiency characteristics of a laser diode become degraded with increasing temperature and age of the laser diode: it is then necessary to have a higher excitation current in order to produce the laser beam, and the output power increases more slowly with increasing excitation current. FIG. 1 shows both a power curve corresponding to a temperature of 20° C. and also a power curve corresponding to a temperature of 85° C., and comparing the curves shows that at 85° C. the currents that need to be applied to the laser diode are higher, that its efficiency is smaller, and that rollover occurs sooner.

There are two known techniques for controlling the electronics driving the excitation current of a laser diode.

The first technique defines a driver constraint as a function of temperature. The temperature of the diode is measured periodically, and the value of the excitation current that needs to be applied is obtained from a model. That technique is relatively simple and enables excitation current levels to be predefined as a function of temperature, while taking account both of the capability of the amplifier for delivering high currents and also of rollovers. In contrast, no account is taken of the laser diode ageing nor is any account taken of the differences that exist between the laser diode being used and the diodes on which the model is based.

In the second technique, the excitation current is servocontrolled on the power of the beam. For this purpose, the control electronics has a photodiode placed in the vicinity of the laser diode in order to measure stray radiation from the laser diode. The power of the stray radiation is proportional to the power of the beam output by the laser diode, and the photodiode is selected to be of the PIN type so that the current passing through it is independent of temperature so that there is a linear relationship between the current passing through the photodiode and the power of the beam output by the laser diode. The setpoint values are constant and they are determined by successive iterations for each emitter device during a calibration stage performed in the factory. The performance of that technique depends on the properties of the photodiode. The operational limitations on that control technique also depend on nonlinearities, such as the capability of the amplifier to deliver excitation current corresponding to the power desired for the beam and such as variation in the rollover point of the laser diode being used as a function of its ageing. In order to remedy that drawback, it is known to put a limit on the desired power over the entire operating range in order to avoid the servocontrol system reaching a non-linear range. Nevertheless, that does not make it possible to maximize the signal-to-noise ratio.

OBJECT OF THE INVENTION

A particular object of the invention is to control the laser diode in such a manner as to produce a laser beam of average power that is as high as possible throughout its operating range.

SUMMARY OF THE INVENTION

To this end, according invention, there is provided a data transmission method including the step of controlling excitation current for a laser diode of a laser beam emitter device by servocontrolling the excitation current on laser beam power and by modulating the excitation current as a function of the data for transmission in order to encode the data with laser beam power levels. The transmission method includes the step of measuring a temperature in the vicinity of the laser diode in order to perform:

a first mode of operation up to a first predetermined temperature threshold, in which mode the excitation current is servocontrolled by using a nominal low setpoint value and a nominal high setpoint value corresponding respectively to a low power level and to a high power level in such a manner that the beam has an average power and an extinction ratio that are optimum for transmitting the data;

a second mode of operation when the temperature exceeds the first temperature threshold, in which mode the excitation current is servocontrolled on a reduced low setpoint value and on a reduced high setpoint value corresponding respectively to a low power level and to a high power level in such a manner that the beam has a reduced average power level while conserving an extinction ratio that is acceptable for transmitting data.

In the nominal mode of operation the setpoint values are selected to allow signals to be transmitted as efficiently as possible by causing the laser diode to operate at optimum power (e.g. determined so as to be as high as possible for some predetermined lifetime of the laser diode). When the temperature exceeds the temperature threshold, the setpoint values are reduced, by being appropriately selected so as to be always less than the point of inflection in the power curve over the temperature range corresponding to the degraded mode of operation. The risk of nonlinearity appearing that the servocontrol cannot handle is thus limited. The laser diode is thus subjected to power servocontrol that takes account of temperature in order to avoid nonlinearity in the servocontrol loop.

The invention also provides a laser beam emitter device for emitting a laser beam to transmit data, the device comprising an electronic processor circuit for creating a current signal representative of data to be transmitted, an amplifier receiving the current signal as input and outputting excitation current for a laser diode, an amplifier control circuit having a first input receiving setpoint values and a second input connected to a photodiode that is placed in the vicinity of the laser diode to supply the control circuit with current representative of the power of the laser beam, and a temperature probe connected to the processor circuit to provide a signal representative of the temperature in the vicinity of the laser diode; the processor circuit being arranged to perform the transmission method of the invention.

The invention also provides a computer program for performing the method and a data medium containing such a program.

Other characteristics and advantages of the invention appear on reading the following description of a particular and nonlimiting implementation of the invention.

BRIEF DESCRIPTION OF THE DRAWINGS

Reference is made to the accompanying drawings, in which.

DETAILED DESCRIPTION OF THE INVENTION

Figure 1:
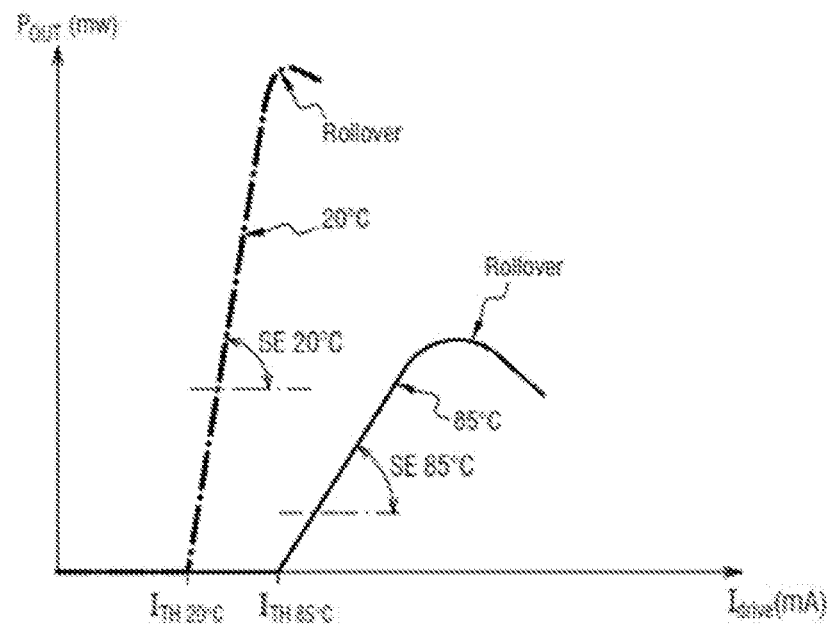
FIG. 1 is a plot of the power $P_{out}$ of the laser beam produced by a laser diode that is powered by an excitation electric current $I_{Drive}$, for two different temperatures.
Figure 2:
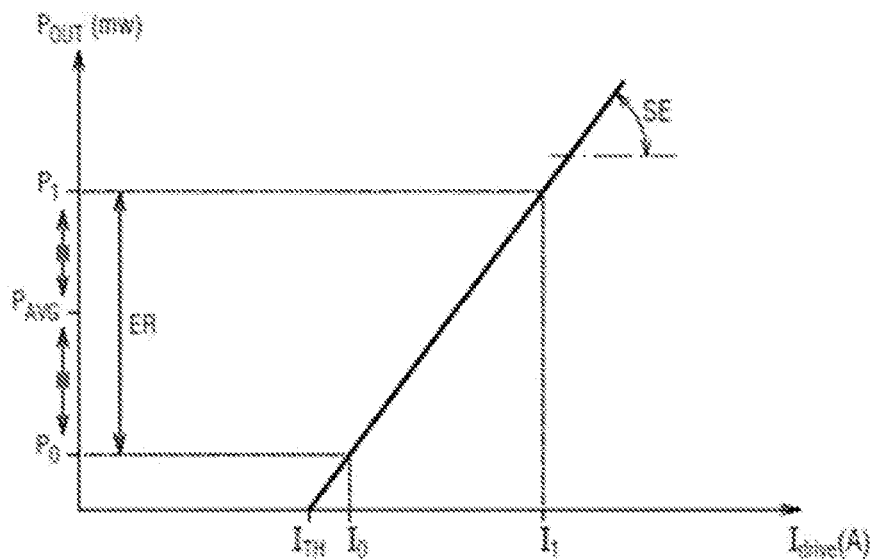
FIG. 2 is a plot of the power of the laser beam produced by a laser diode powered by an excitation current $I_{Drive}$, and showing the extinction ratio and the average power of a laser beam.
Figure 3:
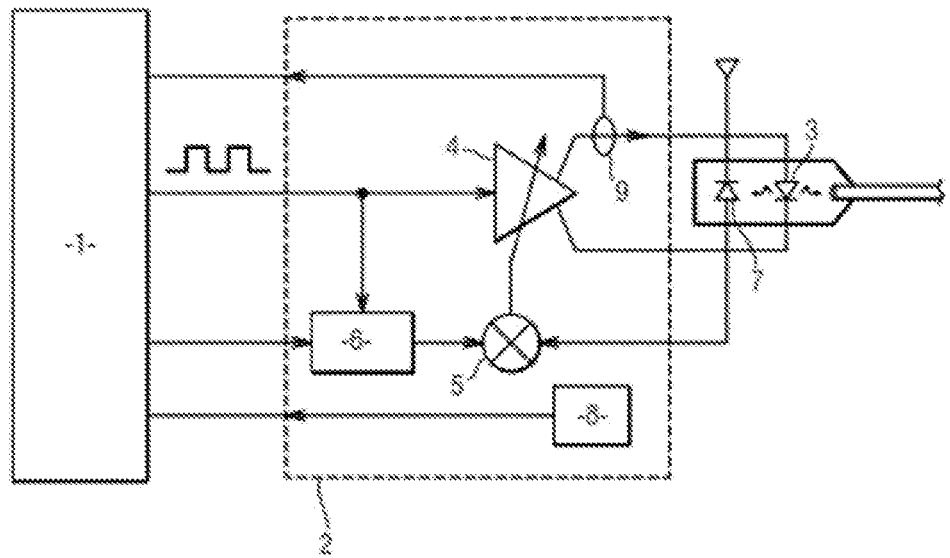
FIG. 3 is a schematic of an emitter device of the invention.

With reference to FIG. 3, the device for emitting a laser beam for transmitting data in implementations of the invention comprises an electronic processor circuit 1 connected via a driver interface 2 to a laser diode 3. The model of the laser diode is of little importance, but by way of example, it is possible to envisage using the component referenced EBS63432-B1634 as produced by the supplier EZCONN.

In this example, the processor circuit 1 comprises both a processor and a memory containing computer programs that are executable by the processor. One of the programs is arranged, in a manner that is itself known, to format data for transmission in compliance with a predefined protocol and to prepare a current signal that is representative of the data for transmission in the format in question.

The driver interface 2 comprises an amplifier 4 having an input connected to the processor circuit 1 in order to receive the current signal representative of the logic level for transmission and an output connected to the laser diode 3 to which the amplifier 4 delivers an excitation current.

The amplifier 4 is of analog type and it has a control input connected to a digital electronic circuit 5 for performing servocontrol. The servocontrol circuit 5 has:

a first input connected to a memory 6, itself connected to the processor circuit 1 in order to select setpoint values from among L0 and L1 as a function of the level of the digital signal that is to be transmitted;

a second input that is connected via an analog-to-digital converter (not shown) to a photodiode 7 placed in the vicinity of the laser diode 3 and that receives a signal $I_{MON}$ representative of the power of the laser beam produced by the laser diode 3. More precisely, in this example, the photodiode 7 is placed so as to capture stray light radiation from behind the laser diode 3, with the power of the stray light radiation being directly linked to the power of the working light beam produced by the laser diode 3;

an output connected via a digital-to-analog converter (not shown) to the control input of the amplifier 4.

The driver interface 2 includes a temperature probe 8 placed in the vicinity of the laser diode 3 and connected to the processor circuit 1 in order to supply it with a temperature signal that is representative of the temperature in the vicinity of the laser diode 3.

The driver interface 2 includes a member 9 for measuring the excitation current I0/I1, which member is located between the amplifier 4 and the laser diode 3 and is connected to the processor circuit 1.

By way of example, the driver circuit 2 is the circuit that has the reference M02099 as produced by the supplier MACOM and that is suitable for installing a communication environment known as a "gigabit capable passive optical network" (G-PON). The physical portion of the G-PON is defined by recommendation ITU-T G.984.2 and its main characteristics for transmission in the uplink direction using this communication protocol, and for the entire operating range (see FIGS. 4 and 6), are summarized below:

data rate 1.244 Gigabits per second (Gb/s);

coding by non-return-to-zero (NRZ) modulation such that logic level 0 is transmitted in the form of a low-power light signal and logic level 1 is transmitted in the form of a high-power light signal;

minimum average power $P_{AVG\ min}$ of the launched optical signal (see FIGS. 4 and 6): +0.5 decibel-milliwatts (dBm);

maximum average power $P_{AVG\ max}$ of the launched optical signal (see FIGS. 4 and 6): +5 dBm;

minimum extinction ratio ER: 10 decibels (dB).

Transmission is performed by modulating the excitation current of the laser diode 3 to have the two current values that are associated with the logic levels 0 and 1 for transmission.

One of the programs of the processor unit thus comprises instructions arranged to perform a transmission method including the step of driving the excitation current of the laser diode 3 with the excitation current being servocontrolled on the power of the laser beam produced by the laser diode 3 and with the excitation current being modulated as a function of data for transmission so as to encode that data with power levels of the laser beam. It can be understood that, in the proposed arrangement: amplifiers such as the amplifier 4 have characteristics that vary from one amplifier to another; likewise analog-to-digital converters and digital-to-analog converters have characteristics that vary from one converter to another; the first input of the servocontrol circuit receives a digital value; and the second input of the servocontrol circuit also receives a digital value that comes from an analog-to-digital converter. As a result of all these variable quantities, it is not possible to devise an exact relationship between the magnitudes manipulated within the servocontrol circuit, the power of the beam, and the currents involved: it is therefore the practice to make use of setpoint values without strict unit.

In a first implementation, the transmission method acts periodically to measure the temperature $T_{INT}$ in the vicinity of the laser diode 3 and to compare it with a predetermined first temperature threshold $T_{SEUIL}$ to perform:

a nominal mode of operation (level 1 in FIGS. 4 and 6) so long as the temperature is less than or equal to the first temperature threshold $T_{SEUIL}$, in which the excitation current is servocontrolled while using a low nominal setpoint value $L_{0\_A}$ and a high nominal setpoint value $L_{1\_A}$ corresponding respectively to a low power level and to a high power level (corresponding respectively to logic level 0 and to logic level 1 in an example implementation making use of NRZ type modulation) in such a manner that the beam presents optimum average power and extinction ratio;

a degraded mode of operation (level 2 in FIG. 4 and level 2 in FIG. 6) when the temperature exceeds the first temperature threshold $T_{SEUIL}$ and in which the excitation current is servocontrolled on a reduced low setpoint value $L_{0\_B}$ and on a reduced high setpoint value $L_{1\_B}$ corresponding respectively to the low power level (logic level 0 with NRZ type modulation) and to the high power level (logic level 1 with NRZ type modulation) in such a manner that the laser beam has reduced average power, while conserving an extinction ratio that is acceptable for transmitting data.

The nominal low setpoint value $L_{0\_A}$ and the nominal high setpoint value $L_{1\_A}$ are stored in the memory of the processor circuit 1. There are defined during a calibration step to obtain a target mean power $P_{AVG\ target}$ corresponding to a percentage of the maximum mean power $P_{AVG\ max}$ that the laser diode 3 is capable of delivering, e.g. 70% (see FIGS. 4 and 6), and to obtain the desired minimum extinction ratio, namely 10 dB.

The calibration step is itself known: it is performed in the factory, by successive iterations, and it consists in setting the setpoint values and in allowing the servocontrol to operate until it converges and reaches an equilibrium point. The setpoint values that are used are those that make it possible, after convergence, to obtain the properties desired for the laser beam. Alternatively, the nominal setpoint values $L_{0\_A}$ and $L_{1\_A}$ are selected as a function of known characteristics of the emitter device. In an example, a calibration stage is performed on a reference emitter device in order to determine the nominal setpoint values $L_{0\_A}$ and $L_{1\_A}$ for other emitter devices. In another example, the nominal setpoint values $L_{0\_A}$ and $L_{1\_A}$ are selected as a function of the characteristics certain component parts of the emitter device.

Figure 4:
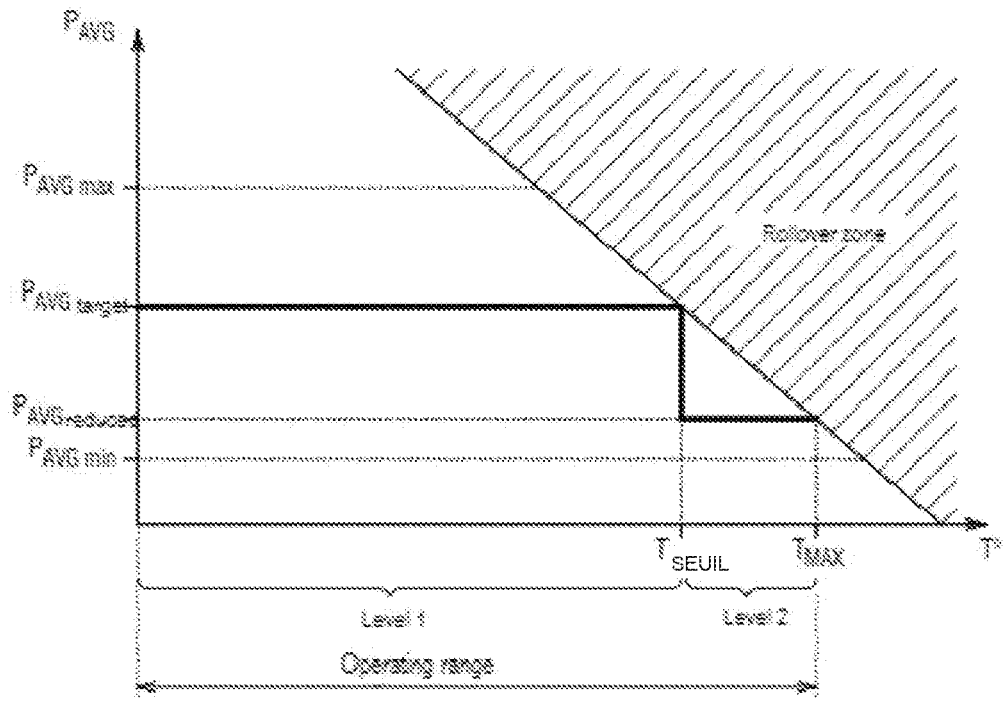
FIG. 4 is a plot of the average power of the laser beam as a function of temperature in a first implementation of the method of the invention.
Figure 5:
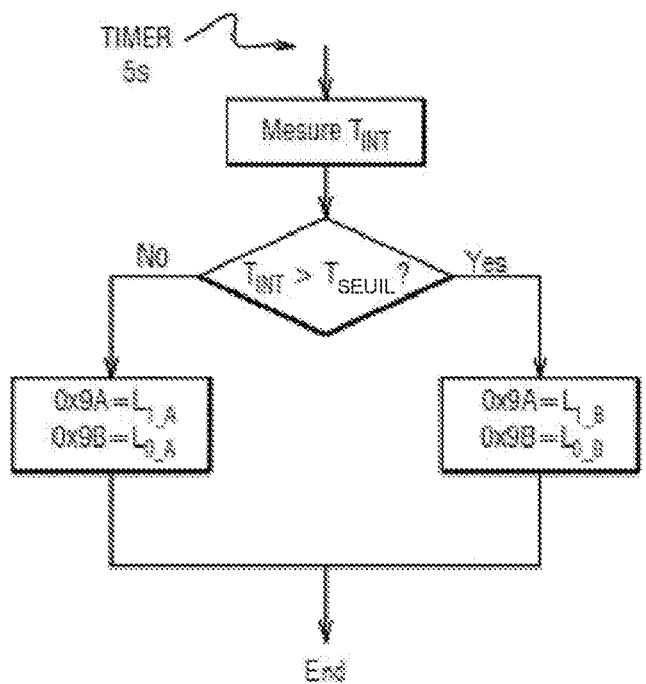
FIG. 5 is a flowchart illustrating the first implementation.

In the first implementation shown in FIGS. 4 and 5, the reduced low setpoint value $L_{0\_B}$ and the reduced high setpoint value $L_{1\_B}$ are fixed values.

In a first example, the reduced low setpoint value $L_{0\_B}$ and the reduced high setpoint value $L_{1\_B}$ are determined experimentally from tests performed on a sample of signal emitter devices by allowing the degraded mode of operation of each emitter device to converge on a reduced high value that results from the convergence and on a reduced low value that results from the convergence.

More precisely, the reduced low setpoint value $L_{0\_B}$ and the reduced high setpoint value $L_{1\_B}$ are defined to be equal to one of the following values:

the average over the entire sample of the reduced low values derived from convergence and the average of the reduced high values derived from convergence;

the minimum over the entire sample of the reduced low values derived from convergence and the minimum of the reduced high values derived from convergence;

the twenty-fifth percentile over the entire sample of the reduced low values derived from convergence and the twenty-fifth percentile of the reduced high values derived from convergence.

In a second example, the reduced low setpoint value $L_{0\_B}$ and the reduced high setpoint value $L_{1\_B}$ are determined by calculation respectively from the nominal low setpoint value $L_{0\_A}$ and from the nominal high setpoint value $L_{1\_A}$.

Thus, the reduced low setpoint value $L_{0\_B}$ and the reduced high setpoint value $L_{1\_B}$ are determined by applying, respectively to the nominal low setpoint value $L_{0\_A}$ and to the nominal high setpoint value $L_{1\_A}$, a reduced value advantageously lying in the range 30% to 40%, and preferably equal to 37%, so as to lower the average transmitted power by about 2 dB while conserving the same extinction ratio. Thus, in the G-PON environment, if the average power is set to 2.5 dB on level 1 corresponding to the nominal mode of operation, an average power of 0.5 dB is obtained on level 2 corresponding to the degraded mode of operation, which remains in compliance with the recommendation ITU-T G.984.2.

Under all circumstances, in the present example, it is ensured that the average power of the beam is greater than the minimum average power by an amount that is sufficient to enable an extinction ratio greater than 10 dB to be obtained. The average power that is used to correspond to the low level is advantageously determined to be higher than the minimum average power so as to enable better reception. By using the reduced setpoint values, this reduced average power can be achieved without using current higher than the current corresponding to the point of inflection in the power curve (the shading in FIG. 4 identifies the entire "rollover" zone that corresponds to powers that cannot be reached as a result of the inflection in the power curve and in spite of increasing the excitation current).

The first temperature threshold $T_{SEUIL}$ is situated in register with the point of intersection between the curve for target average power $P_{AVG\ target}$ in the nominal mode of operation and the edge of the rollover zone.

The reduced low setpoint value $L_{0\_B}$ and the reduced high setpoint value $L_{1\_B}$ are stored in the memory of the processor circuit 1.

In operation (see FIG. 5), the processor circuit 1 acts every 5 seconds to acquire the temperature measurement $T_{INT}$ and to compare it with the first temperature threshold $T_{SEUIL}$.

If the temperature $T_{INT}$ is lower than the first temperature threshold $T_{SEUIL}$, then the processor circuit 1 performs the nominal mode by writing the nominal low setpoint value $L_{0\_A}$ and the nominal high setpoint value $L_{1\_A}$ in registers of the memory 6 (for example, respectively in the register at the address 0x9A and in the register at the address 0x9B of the memory 6 in the MACOM M02099 component) where the servocontrol circuit 5 looks them up in order to control the amplifier 4 so as to servocontrol the excitation current between these two values as a function of the signal $I_{MON}$ representative of the power of the laser beam.

If the temperature $T_{INT}$ is higher than the first temperature threshold $T_{SEUIL}$, then the processor circuit 1 performs the degraded mode of operation by writing the reduced low setpoint value $L_{0\_B}$ and the reduced high setpoint value $L_{1\_B}$ in the registers of the memory 6 (for example, respectively in the registers at the addresses 0X9A and 0x9B) where the servocontrol circuit 5 looks them up in order to control the amplifier 4 so as to servocontrol the excitation current between these two values as a function of the signal $I_{MON}$ representative of the power of the laser beam.

In order to avoid rewriting the setpoint values in the memory 6 every 5 seconds, it is possible to make provision for the processor circuit 1:
 to record the most recent values it has written to the memory 6 in its own memory;
 after determining which setpoint values need to be applied, to compare those setpoint values that need to be applied with the setpoint values most recently written to memory;
 only if these setpoint values that need to be applied are different from the setpoint values most recently written to memory, to proceed with writing the setpoint values that need to be applied in the memory 6.

In order to avoid switching rapidly from one mode of operation to the other, the processor circuit 1 switches from the nominal mode of operation to the degraded mode of operation when the temperature $T_{INT}$ in the vicinity of the laser diode 3 exceeds the first temperature threshold $T_{SEUIL}$ by a predetermined excess value and switches from the degraded mode of operation to the nominal mode of operation when the temperature $T_{INT}$ in the vicinity of the laser diode 3 passes below the first temperature threshold $T_{SEUIL}$ minus a predetermined return value. In this example, the excess value and the return value are equal to 3° C.

In this implementation, a second temperature threshold $T_{MAX}$, or limit threshold, is provided that is higher than the first temperature threshold $T_{SEUIL}$.

The second temperature threshold $T_{MAX}$ is situated in register with the point of intersection between the curve for reduced average power $P_{AVG\ reduced}$ in the degraded mode of operation and the edge of the rollover zone.

The processor circuit 1 acts every 5 seconds to acquire the temperature measurement $T_{INT}$ and to compare it with the second temperature threshold $T_{MAX}$. If the temperature measurement $T_{INT}$ exceeds the second temperature threshold $T_{MAX}$, the processor circuit 1 switches off the power to the amplifier 4 so that the laser diode 3 is no longer powered, thereby enabling it to cool down and avoiding premature ageing. The processor circuit 1 can then issue a warning, sending an error message to the data transmitting unit that is connected to the processor circuit 1.

In a variant, in the event of crossing the second temperature threshold $T_{MAX}$, it is also possible to make provision for further reducing the reduced setpoint values in order to limit the power of the laser beam, but while accepting the risk of signals being transmitted imperfectly.

Figure 6:
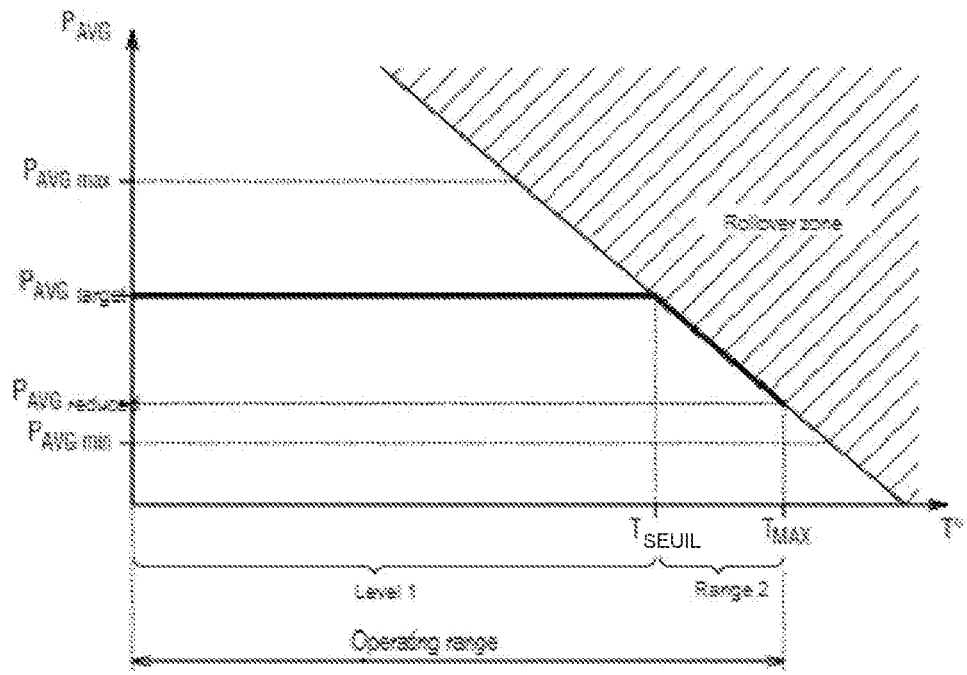
FIG. 6 is a plot of the average power of the laser beam as a function of temperature in a second implementation of the method of the invention.
Figure 7:
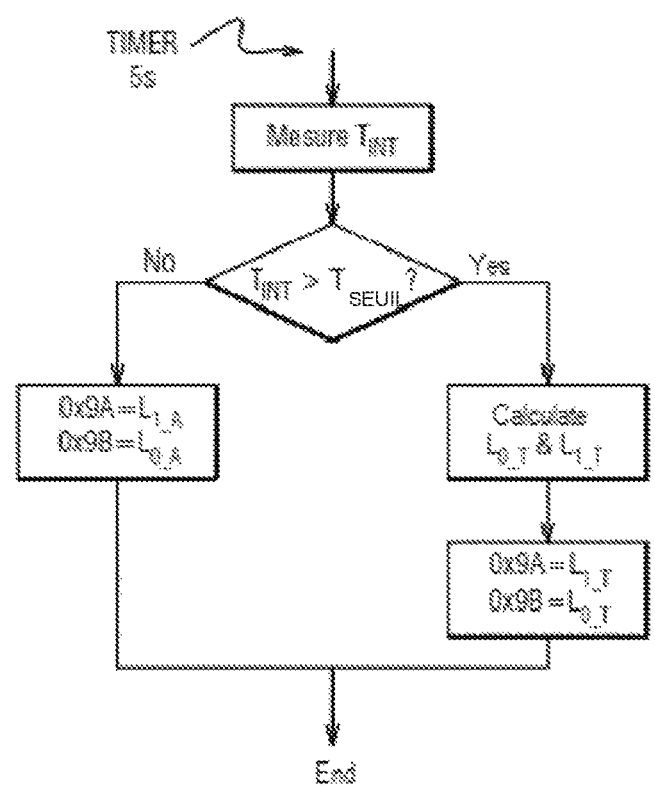
FIG. 7 is a flowchart illustrating the second implementation.

In the second implementation shown in FIGS. 6 and 7, the reduced low setpoint value $L_{0\_B}$ and the reduced high setpoint value $L_{1\_B}$ that are used are determined as in the first implementation, but they are used as theoretical reduced setpoint values.

These theoretical setpoint values are used for calculating the reduced low setpoint value $L_{0\_T}$ that is used for servocontrol and a reduced high setpoint value $L_{1\_T}$ that is used for servocontrol. The calculation is performed while the emitter device is in operation, and it comprises a linear interpolation from the nominal setpoint values $L_{0\_A}$, $L_{1\_A}$, from the theoretical reduced setpoint values $L_{0\_B}$, $L_{1\_B}$, from the determined temperature $T_{INT}$, from the first temperature threshold $T_{SEUIL}$, and from the second temperature threshold $T_{MAX}$ in such a manner that:
 the reduced low setpoint value $L_{0\_T}$ that is used for servocontrol is equal to $$L_{0\_T} = L_{0\_A} + (T_{INT} - T_{SEUIL}) \frac{L_{0\_B} - L_{0\_A}}{T_{MAX} - T_{SEUIL}}$$

the reduced high setpoint value $L_{1\_T}$ that is used for servocontrol is equal to $$L_{1\_T} = L_{1\_A} + (T_{INT} - T_{SEUIL}) \frac{L_{1\_B} - L_{1\_A}}{T_{MAX} - T_{SEUIL}}$$

Unlike the first implementation, in which the average power curve forms a step between the first level (horizontal line for level 1 in FIG. 4) and the second level (horizontal line for level 2 in FIG. 4), the average power curve presents a downward slope in the temperature range corresponding to the degraded mode of operation (range 2 in FIG. 5). This downward slope coincides with the edge of the rollover zone between the temperature thresholds $T_{SEUIL}$ and $T_{MAX}$.

Operation is shown in FIG. 7: it is identical to the operation of the first implementation except that the processor circuit 1 needs to calculate the reduced low setpoint value $L_{0\_T}$ used for servocontrol and the reduced high setpoint value $L_{1\_T}$ used for servocontrol immediately prior to writing them in the memory 6 in order to perform the degraded mode of operation.

Naturally, the invention is not limited to the embodiments described and covers any variant coming within the ambit of the invention as defined by the claims.

In particular, some or all of the implementations can easily be adapted to cover other communication protocols, such as those known as E-PON, XGS-PON, 10GEPON . . . or any other control components from the supplier MACOM or from other suppliers, such as, for example SEMTECH or UXFASTIC.

In the example described, use is made of NRZ modulation, in which the optical signal that is launched takes on two powers depending on whether it is conveying a 0 or a 1. It thus enables one bit to be conveyed per symbol time, and it is well adapted to data rates of up to 25 Gb/s. Nevertheless, other forms of modulation can be used for the same data rates or for other data rates. For example, above 25 Gb/s, PAM4 modulation is used, which enables two bits to be conveyed per symbol time, the optical signal that is launched taking on four powers depending on whether it is conveying a 00, 01, 10, or 11 symbol. More generally, in certain implementations, it is possible to use any communication protocol relying on a transmission technique having a plurality of logic levels, e.g. such as the derivatives of pulse amplitude modulation (PAM).

In the example described, transmission of a logic level 0 is performed by launching a low-power light signal into the optical fiber (power equal to a few hundreds of microwatts) and transmission of a logic level 1 is performed by launching a higher power light signal into the optical fiber (power equal to a few milliwatts). Naturally, the opposite convention could be used.

In a variant, it is possible to omit the second temperature threshold. In the second implementation, this amounts to allowing the interpolation to continue beyond the temperature corresponding to the second threshold, which is not problematic for the laser diode since it is protected by the fact that the average power is reduced, but which limits capacity for transmitting data.

It is possible to combine the two implementations that are described above. This is not essential, and in the second implementation, the reduced low setpoint value $L_{0\_T}$ that is used for servocontrol and the reduced high setpoint value $L_{1\_T}$ that is used for servocontrol may be calculated differently.

The reduced setpoint values $L_{0\_B}$ and $L_{1\_B}$ may be determined by successive iterations during a calibration stage.

When the reduced values are determined by calculation, it is advantageous for the temperature $T_{INT}$ in the vicinity of the laser diode to be determined with a predetermined period and for the reduced setpoint values $L_{0\_B}$ and $L_{1\_B}$ to be calculated for that period.

The laser diode is controlled so that, in the third mode of operation (the temperature exceeds the second predetermined temperature threshold $T_{MAX}$), operation is obtained that is even more limited than in the second mode of operation.

The temperature measurement period may be shorter than or longer than 5 seconds.

The temperature thresholds, the excess value, and the return value may be different from those described. The second temperature threshold is optional.

The structure of the device may be different. The temperature probe may be situated outside the driver interface 2.

The measurement member 9 is optional.

The invention claimed is:

1. A data transmission method including the step of controlling excitation current for a laser diode of a laser beam emitter device by servocontrolling the excitation current on laser beam power and by modulating the excitation current as a function of the data for transmission in order to encode the data with laser beam power levels, the method being characterized in that it includes the step of measuring a temperature in the vicinity of the laser diode in order to perform:

a first mode of operation up to a first predetermined temperature threshold, in which mode the excitation current is servocontrolled by using a nominal first setpoint value and a nominal second setpoint value corresponding respectively to a first power level and to a second power level in such a manner that the beam has an average power and an extinction ratio that are optimum for transmitting the data, the nominal first setpoint value being lower than the nominal second setpoint value;

a second mode of operation when the temperature exceeds the first temperature threshold, in which mode the excitation current is servocontrolled on a reduced first setpoint value and on a reduced second setpoint value corresponding respectively to the first power level and to the second power level in such a manner that the beam has a reduced average power level while conserving an extinction ratio that is acceptable for transmitting data, the reduced first setpoint value being lower than the reduced second setpoint value.

2. The method according to claim 1, wherein the reduced setpoint values are determined by successive iterations during a calibration stage.

3. The method according to claim 1, wherein the reduced setpoint values are determined by calculation on the basis of the nominal setpoint values.

4. The method according to claim 3, wherein the temperature in the vicinity of the laser diode is determined with a predetermined period and the reduced setpoint values are calculated for that period.

5. The method according to claim 1, wherein the reduced setpoint values are determined by calculation during operation of the emitter device and the calculation is a linear interpolation on the basis of the nominal setpoint values, of the determined temperature and of the first operating temperature threshold.

6. The method according to claim 5, wherein the linear interpolation is also based on reduced theoretical setpoint values, for a second operating temperature threshold such that:

the reduced first setpoint value $L_{0\_T}$ that is used for servocontrol is equal to $$L_{0\_T} = L_{0\_A} + \frac{L_{0\_B} - L_{0\_A}}{T_{MAX} - T_{SEUIL}}$$

the reduced second setpoint value $L_{1\_T}$ that is used for servocontrol is equal to $$L_{1\_T} = L_{1\_A} + \frac{L_{1\_B} - L_{1\_A}}{T_{MAX} - T_{SEUIL}}$$

where $L_{0\_A}$ is the first nominal setpoint value, $L_{0\_B}$ is the reduced first setpoint value, $T_{MAX}$ is the second operating temperature threshold, $T_{SEUIL}$ is the first operating temperature threshold, $L_{1\_A}$ is the second nominal setpoint value, and $L_{1\_B}$ is the reduced second setpoint value.

7. The method according to claim 1, wherein the reduced setpoint values are determined experimentally from tests performed on a sample of signal emitter devices by allowing the degraded mode of operation of each emitter device to converge on a reduced second value and on a reduced first value that result from the convergence, the reduced first value being lower than the reduced second value.

8. The method according to claim 7, wherein the reduced setpoint values are substantially equal to one of the following values:

the average of the reduced first values derived from convergence and the average of the reduced second values derived from convergence;

the minimum of the reduced first values derived from convergence and the minimum of the reduced second values derived from convergence;

the twenty-fifth percentile of the reduced second values derived from convergence and the twenty-fifth percentile of the reduced first values derived from convergence.

9. The method according to claim 1, wherein a third mode of operation is performed when the temperature exceeds a second predetermined temperature threshold.

10. The method according to claim 9, wherein in the third mode of operation, the laser diode is controlled to operate in a manner that is even more limited than in the second mode of operation.

11. The method according to claim 1, wherein the method switches from the nominal mode of operation to the degraded mode of operation when the temperature in the vicinity of the laser diode exceeds the first temperature threshold by a predetermined excess value, and switches from the degraded mode of operation to the nominal mode of operation when the temperature in the vicinity of the laser diode passes below the first temperature threshold minus a predetermined return value.

12. A computer program including instructions arranged to perform a transmission method according to claim 1.

13. A data medium containing a computer program including instructions arranged to perform a transmission method according to claim 1.

14. A laser beam emitter device for emitting a laser beam to transmit data, the device comprising an electronic processor circuit for creating a current signal representative of data to be transmitted, an amplifier receiving the current signal as input and outputting excitation current for a laser diode, an amplifier control circuit having a first input receiving setpoint values and a second input connected to a photodiode that is placed in the vicinity of the laser diode to supply the control circuit with current representative of the power of the laser beam, and a temperature probe connected to the processor circuit to provide a signal representative of the temperature in the vicinity of the laser diode; the processor circuit being arranged to perform a transmission method including the step of measuring a temperature in order to perform:

a first mode of operation up to a first predetermined temperature threshold, in which mode the excitation current is servocontrolled by using a nominal first setpoint value and a nominal second setpoint value corresponding respectively to a first power level and to a second power level in such a manner that the beam has an average power and an extinction ratio that are optimum for transmitting the data, the nominal first setpoint value being lower than the nominal second setpoint value;

a second mode of operation when the temperature exceeds the first temperature threshold, in which mode the excitation current is servocontrolled on a reduced first setpoint value and on a reduced second setpoint value corresponding respectively to a first power level and to a second power level in such a manner that the beam has a reduced average power level while conserving an extinction ratio that is acceptable for transmitting data, the reduced first setpoint value being lower than the reduced second setpoint value.

\* \* \* \* \*